United States Patent [19]
Lin et al.

[11] Patent Number: 6,042,999
[45] Date of Patent: Mar. 28, 2000

[54] ROBUST DUAL DAMASCENE PROCESS

[75] Inventors: Cheng-Tung Lin, Taichung; Yu-Hua Lee, Hsinchu; Jenn Ming Huang, Hsin-Chu; Cheng-Ming Wu, Kao-Hsiung, all of Taiwan

[73] Assignee: Taiwan Semiconductor Manufacturing Company, Hsin-Chu, Taiwan

[21] Appl. No.: 09/073,952

[22] Filed: May 7, 1998

[51] Int. Cl.[7] ....................................................... G03F 7/26
[52] U.S. Cl. ............................................ 430/316; 430/313
[58] Field of Search ................................... 430/312, 313, 430/314, 316

[56] References Cited

U.S. PATENT DOCUMENTS

| | | | |
|---|---|---|---|
| 5,604,156 | 2/1997 | Chung et al. .............................. | 437/195 |
| 5,614,765 | 3/1997 | Avanzino et al. ......................... | 257/774 |
| 5,635,423 | 6/1997 | Huang et al. ............................. | 437/195 |
| 5,686,354 | 11/1997 | Avanzino et al. ......................... | 437/190 |
| 5,702,982 | 12/1997 | Lee et al. .................................. | 437/195 |
| 5,705,430 | 1/1998 | Avanzino et al. ......................... | 437/195 |
| 5,741,626 | 4/1998 | Jain et al. ................................. | 430/314 |
| 5,801,094 | 9/1998 | Yew et al. ................................. | 438/624 |
| 5,899,720 | 5/1999 | Mikagi ...................................... | 438/303 |
| 5,904,863 | 5/1999 | Hatfield et al. ........................... | 216/92 |

*Primary Examiner*—Kathleen Duda
*Attorney, Agent, or Firm*—George O. Saile; Stephen B. Ackerman

[57] ABSTRACT

A robust dual damascene process is disclosed where the substructure in a substrate is protected from damage caused by multiple etchings required in a damascene process by filling a contact or via hole opening with a protective material prior to the forming of the conductive line opening of the damascene structure having an etch-stop layer separating a lower and an upper dielectric layer. In the first embodiment, the protective material is partially removed from the hole opening reaching the substructure prior to the forming of the upper conductive line opening by etching. In the second embodiment, the protective material in the hole is removed at the same time the upper conductive line opening is formed by etching. In a third embodiment, the disclosed process is applied without the need of an etch-stop layer for the dual damascene process of this invention.

41 Claims, 5 Drawing Sheets

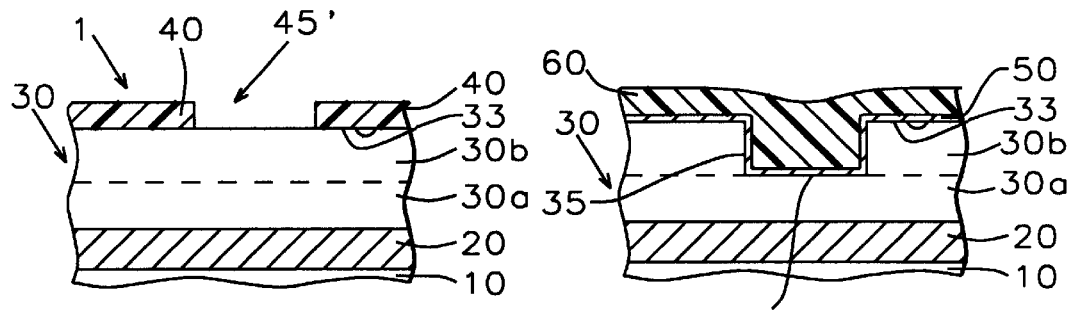
FIG. 1a - Prior Art
FIG. 1d - Prior Art
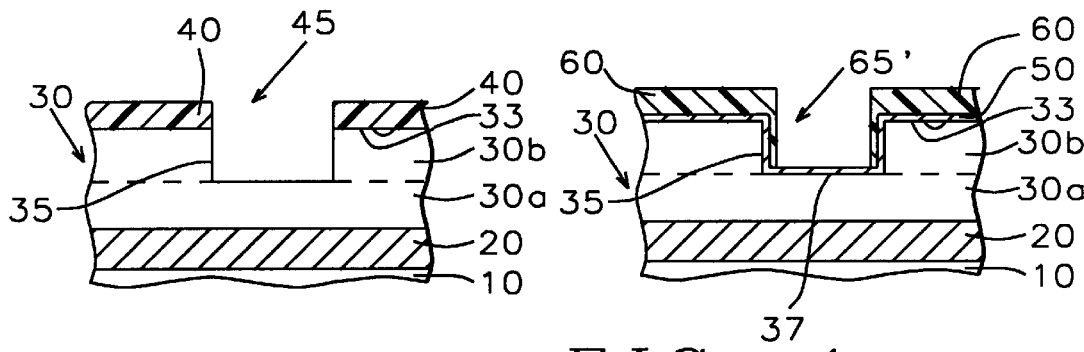
FIG. 1b - Prior Art
FIG. 1e - Prior Art
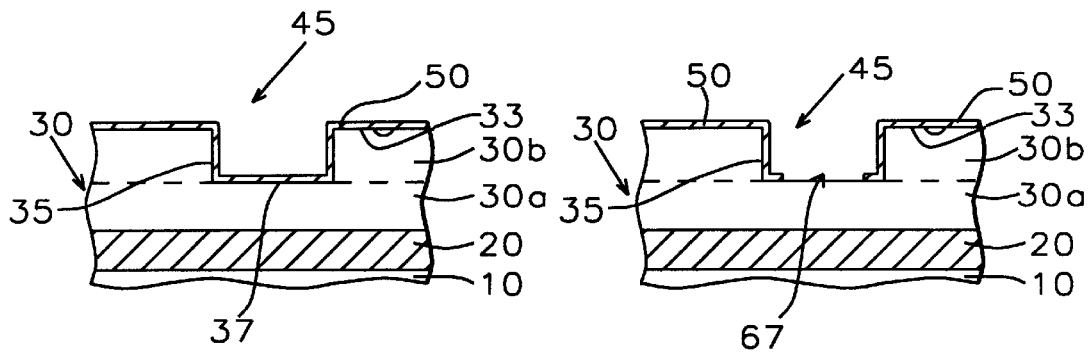
FIG. 1c - Prior Art
FIG. 1f - Prior Art

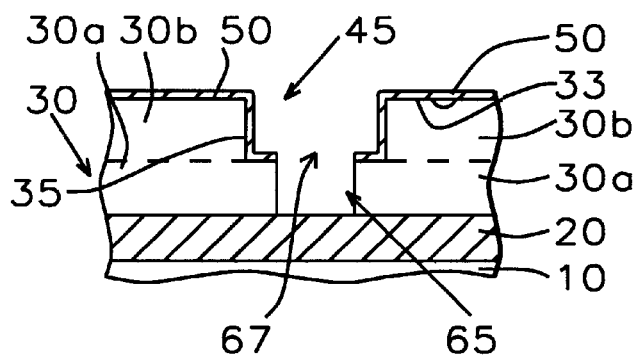
FIG. 1g - Prior Art
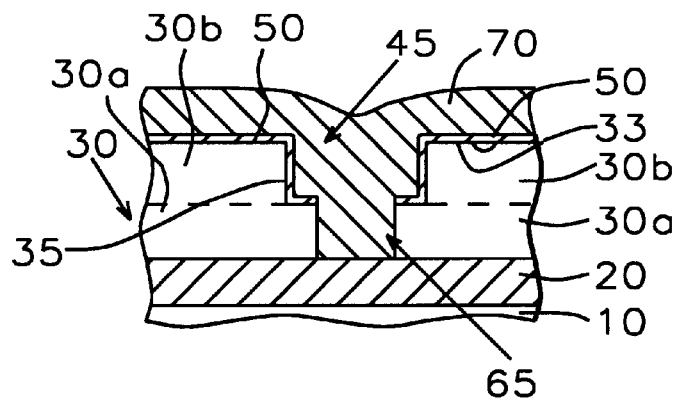
FIG. 1h - Prior Art
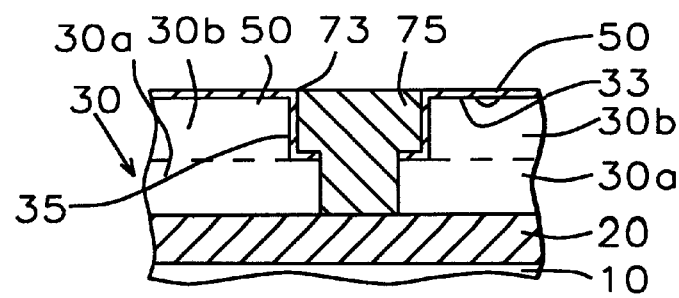
FIG. 1i - Prior Art

ROBUST DUAL DAMASCENE PROCESS

BACKGROUND OF THE INVENTION

(1) Field of the Invention

The present invention relates to the manufacture of ultra large scale integrated (ULSI) circuit chips in general, and in particular, to forming interconnects in a semiconductor substrate by using an improved damascene process.

(2) Description of the Related Art

With the advent of very and ultra large scale integration (VLSI and ULSI) circuits, the number of interconnections in a semiconductor substrate has increased astronomically. The interconnections are made between passive and active devices within the substrate, as well as between a multitude of wiring layers that constitute the circuits on the substrate. Damascene is a process which simplifies the forming of interconnections in a semiconductor substrate.

In the single damascene process, grooves are formed in an insulating layer and filled with metal to form conductive lines. Dual damascene takes the process one step further in that, in addition to forming the grooves of a single damascene, the conductive hole openings are also formed in the insulating layer. The resulting composite structure of grooves and holes are filled with metal. The process is repeated as many times as required to form the multi-level interconnections between metal lines and the holes formed in between. Contact holes are formed directly over the substrate where the metal in the hole contacts the surface of the substrate, while the via holes are formed between metal layers.

In contrast, conventionally, the metal layers and the interconnecting layers are formed separately, and serially. First, a first blanket metal is deposited on a first insulating layer and electrical lines are formed by subtractive etching of the metal through a first mask. A second insulating layer is formed over the first metallized layer, and the second insulating layer is patterned with holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new electrical lines, and the process is repeated as many times as it is needed to fabricate a semiconductor substrate.

In the standard dual damascene process the insulating layer is coated with a resist material which is exposed to a first mask with the image pattern of the via opening and the pattern is anisotropically etched in the upper half of the insulating layer. After removal of the patterned resist material, the insulating layer is coated with another resist material which is exposed to a second mask with image pattern of the conductive lines in alignment with the via openings. In anisotropically etching the openings for the conductive line in the upper half of the insulating material, the via openings already present in the upper half are simultaneously etched in the lower half of the insulating material. After the etching is complete, both the vias and grooves are filled with metal.

Although this standard dual damascene offers advantages over other conventional processes for forming interconnections, it has a number of disadvantages, such as the edges of the via openings in the lower half of the insulating layer are poorly defined because of the two etchings and the via edges being unprotected during the second etching, as described by Avanzino, et al., in U.S. Pat. No. 5,686,354.

Avanzino uses a thin via mask in forming the via openings in order to protect the edges from irregularities. Thus, following Avanzino, a portion of an interconnection structure (1) shown in FIG. 1a, is coated with a layer (40) of commercially available resist and with a conductive line pattern (45) as shown in FIGS. 1b and 1c. Resist layer (40) is coated on the surface (33) of an insulating layer (30), which is usually an oxide of about 1 micrometer ($\mu$m) thick. Layer (30) is shown to have a lower portion (30a) and an upper portion (30b) in FIG. 1a in order to facilitate the description of the steps of this conventional process.

The resist is a positive resist and the undeveloped resist (40) serves as an etch mask for etching a conductive line opening (45') in the uncovered surface (33) of the insulating layer. The conductive line opening and a subsequent via opening, when filled with a conductive material, will provide an interconnection to a conductive line (20) in an underlying insulating layer (10). As illustrated in FIG. 1b, the insulating layer at the uncovered surface (33) is anisotropically etched with a plasma gas(es), such as carbon tetrafluoride ($CF_4$), in a commercially available etcher, such as a parallel plate reactive ion etch (RIE) apparatus or, alternatively, an electron cyclotron resonance (ECR) plasma reactor to replicate the mask pattern in the upper portion (30b) and thereby create the conductive line opening (45) in layer (30). Resist layer (40) serves as an etch barrier during etching, which is timed for a predetermined depth, which is usually half the thickness of insulating layer (30). A negative resist, in place of the positive resist, can also be used with the mask pattern being reversed.

After resist layer (40) is removed by a conventional technique such as ashing in an oxygen ($O_2$) plasma, a thin conformal etch barrier layer (50) is deposited on the surface (33) of the insulating layer and walls (35) and bottom (37) of the conductive line opening (45) as shown in FIG. 1c. Conventional etch barriers, or etch-stops are silicon nitride ($Si_3N_4$, SiN), silicon oxynitride ($SiO_xN_y$), and titanium nitride (TiN). The etch properties of the etch barrier are such that it is or exhibits selectivity to the etchant, such as carbon tetrafluoride ($CF_4$) containing fluorine atoms for the $SiO_2$.

As shown in FIG. 1d, a second coating of positive resist (60) is applied as a thick layer on the etch barrier layer (50). A via pattern (65') is formed in resist layer (60) in alignment with the conductive line opening (45), as shown in FIGS. 1e and 1f. The undeveloped resist (60) serves as an etch mask for anisotropically etching an opening (67) in the etch-stop layer (50) which in turn is used as a mask in etching via hole (65) into lower portion (30a) as shown in FIG. 1g. That is, Avanzino, et al., teach the removal of thick resist mask (60) prior to the etching, although could remain during the etching of the via hole. This is because, a thin mask, such as the thin, about 1000 Å TiN thick etch barrier layer (50) provides more precise edges for etching via opening (65) in contrast to a thick mask. Barrier layer (50) remains in the openings in filling the conductive line opening (45) and via opening (65) with a conductive material (70) such as aluminum copper. Substrate (1) is then subjected to chemical mechanical polishing, thus forming a flat, planarized surface (73) and a composite metal interconnection (75) of the dual damascene structure shown in FIG. 1f.

In another U.S. Pat. No. 5,614,765, Avanzino, et al., disclose a method of forming self aligned via dual damascene using only one mask pattern for the formation of both the conductive lines and vias. A different method of forming conductive lines, or wires, for a semiconductor device is disclosed in U.S. Pat. No. 5,604,156. Huang, et al., teach a the forming of an interconnection structure having a reduced interwiring spacing by a modified dual damascene process.

While prior art has addressed some of the disadvantages and problems associated with standard dual damascene process as described above, the present invention addresses still another problem, namely, the problem of damage caused to a substrate surface, such as silicon, when that surface is unprotected and exposed to multiple etching energy while dual forming of the conductive line and hole openings of the dual damascene structure.

SUMMARY OF THE INVENTION

It is therefore an object of the present invention to provide method of forming interconnections in a semiconductor substrate by using an improved robust damascene process.

It is another object of this invention to provide a method of forming a dual damascene structure without imparting any damage to substrate surface.

It is still another object of this invention to provide a protective filling in the contact and via holes while etching the conductive line openings of the dual damascene structure, in order to protect the surface exposed at the bottom of the hole.

These objects are accomplished by providing a semiconductor substrate having a substructure comprising devices formed in said substrate and a metal layer formed thereon; forming a lower level dielectric (LLD) layer over said substrate; forming an etch-stop layer over said LLD layer; forming an upper level dielectric (ULD) layer over said etch-stop layer; forming a first photoresist layer over said ULD layer; patterning said first photoresist layer with a hole pattern; etching through said hole pattern in said first photoresist layer into said ULD layer; etching further said hole pattern into said etch-stop layer; etching further said hole pattern into said LLD layer until a lower level said substructure of said substrate is reached; removing said first photoresist layer from said substrate; forming a bottom-antireflective coating (BARC) over said substrate and filling said hole opening with said BARC; forming a second photoresist layer over said BARC over said substrate including said hole opening; patterning said second photoresist layer with a conductive line opening pattern; performing a timed-etch through said conductive line opening in said second photoresist layer to remove said BARC from said hole opening in said ULD layer and partially from said hole opening in said LLD layer; etching through said conductive line opening in said second photoresist layer into said ULD layer until etch-stop layer is reached; removing said second photoresist layer; removing remaining said BARC from said hole opening in said LLD layer; forming metal in said conductive line opening in said ULD layer and hole opening through said etch-stop layer and in said LLD layer; and removing said metal from the surface of said substrate for subsequent process steps to complete the fabrication of a semiconductor substrate.

These objects are further accomplished in a second embodiment, by first removing as portion of the protective BARC layer from the hole opening of the dual damascene structure and then forming the conductive line opening in the upper layer dielectric (ULD) layer. Further, in a third embodiment, the robust damascene structure of this invention is formed without the need for a etch-stop layer.

BRIEF DESCRIPTION OF THE DRAWINGS

FIGS. 1a–1i show the forming of a dual damascene structure according to prior art.

DESCRIPTION OF THE PREFERRED EMBODIMENTS

Referring now the drawings, in particular to FIGS. 2a–2i, there is shown a method of forming a dual damascene structure with a protective cover over the hole opening so that the underlying substructure of the substrata is not damaged during the previous etching steps of forming the composite conductive line opening and the hole opening.

Figure 2A:
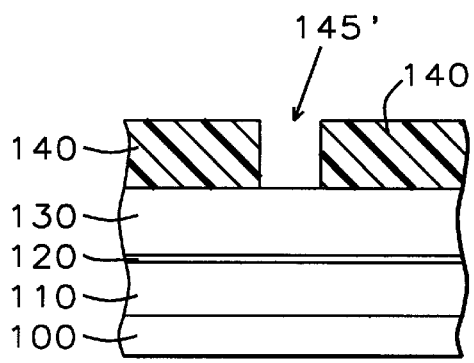
FIG. 2a shows the patterning of a resist layer with the image of a hole opening for the dual damascene structure of this invention.
Figure 2D:
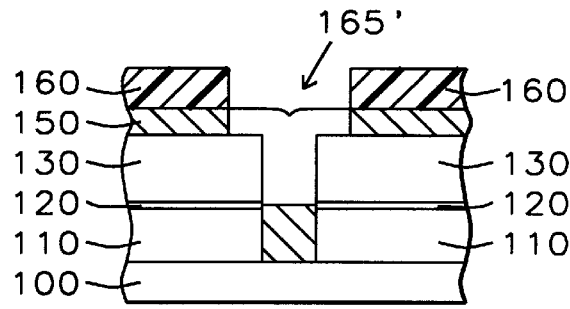
FIG. 2d shows a first embodiment of the present invention where the protective material is partially removed from the hole of FIG. 2c.

FIG. 2a shows a portion of a semiconductor substrate (100), preferably silicon, provided with a substructure of devices (not shown) formed in the substrate or, portions of metal layers thereof, and as they are not significant to the invention, they are not described in detail in order not to unnecessarily obscure the present invention. However, it will be noted that the lower hole portion of the damascene structure that will be formed according to this invention will have exposed at its bottom either the substrate surface or the surface of the metal layer substructure that need to be protected from the damage caused by previous etching steps. Usually, the damage caused to either a metal substructure or a silicon surface result in reliability problems as well as high contact resistances at the respective interfaces.

In FIG. 2a, two layers of dielectric, a lower layer dielectric (LLD), (110), and an upper layer (130), (ULD), are formed with an intervening etch-stop layer (120). Usually, a dielectric layer is referred to as an interlevel dielectric (ILD) layer when formed over a semiconductor surface, such as silicon, and as an intermetal dielectric (IMD) layer when formed over a metal layer substructure. The present disclosure provides protection for either a semiconductor substructure exposed under a contact hole, or a metal substructure under a via hole, and therefore, the more general terms LLD and ULD will be used to distinguish the two layers of dielectric, and the term "hole" to refer to either contact or via holes.

Dielectric layers are known in the art. Both lower (LLD) and upper (ULD) layers shown in FIG. 2a may be formed from materials including but not limited to silicon oxide materials, silicon nitride materials, and silicon oxynitrides materials formed within integrated circuits through methods including but not limited to CVD, PECVD, PVD sputtering methods. For the preferred embodiment of the present invention, both LLD and ULD layers have a thickness between about 8,000 to 15,000 angstroms (Å).

Etch-stop layer (120) is a thin conformal material which can be silicon nitride ($Si_3N_4$, SiN), silicon oxynitride ($SiO_xN_y$), and titanium nitride (TiN). Silicon nitride is preferred for this embodiment because it has high selectivity to the etchant used in etching the dielectric layers. SiN is formed by reacting dichlorosilane ($SiCl_2H_2$) with ammonia ($NH_3$) in an LPCVD at a pressure between about 0.25 to 1.0 torr, temperature between about 650 to 750° C. and at flow rates between about 80 to 120 standard cubic centimeters per minute (sccm), and with a thickness between about 500 to 1,500 Å.

Figure 2B:
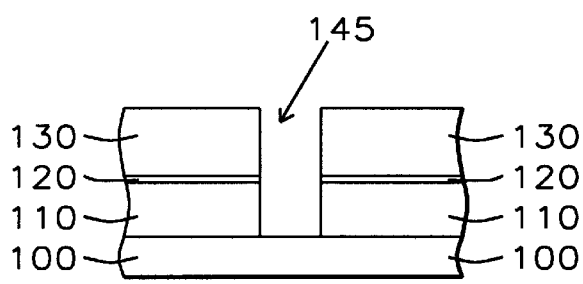
FIG. 2b shows the forming of the hole opening of FIG. 2a into the two dielectric layers of the dual damascene structure of this invention.

After the forming of LLD, ULD and etch-stop layers, a first photoresist layer (140) of a thickness between about 1.0 to 1.2 Å is formed and then patterned with a mask having a hole pattern (145'), as shown in FIG. 2a. The hole pattern is next etched into the ULD, etch-stop and LLD layers as shown in FIG. 2b, forming hole (145), which, at its bottom, exposes the underlying substructure of substrate (100). It is preferred that the etching of both ULD layer (130) and LLD layer (110) is performed with recipe comprising gases $CF_4/CHF_3$ at flow rates between about 10 to 100 sccm, 10 to 100 sccm, and similarly the etch stop layer (120). Subsequent to forming the hole pattern in the substrate as shown in FIG. 2b, first photoresist layer (140) is removed with oxygen ashing.

Figure 2E:
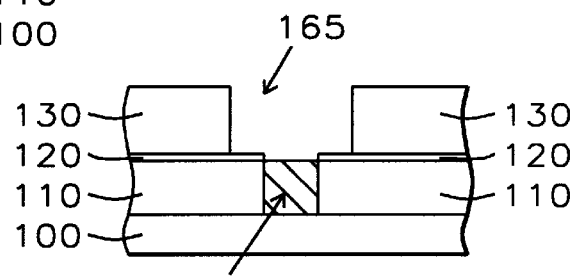
FIG. 2e shows a second embodiment of this invention where the etching of the conductive line opening into the second dielectric layer and the partial removal of a portion of the protective filling from the hole opening are performed simultaneously, according to this invention.
Figure 2C:
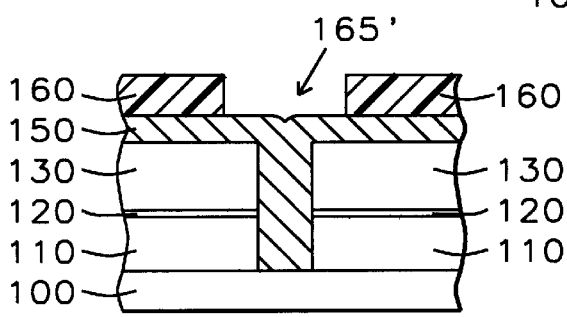
FIG. 2c shows the filling of the hole opening of FIG. 2b with a protective material of this invention and the patterning of a second photoresist layer over the protective layer with the conductive line images for the dual damascene structure of this invention.

At the next step, and as a main feature and key aspect of the present invention, an anti-reflective coating material, referred to as ARC, is formed over the substrate filling hole (145), thus forming a protective cover over the exposed substructure at the bottom of the hole, as shown in FIG. 2c. Anti-reflective coatings, which can be polymers as mentioned in Wolf, S., and Tauber, R.N. "Silicon Processing for the VLSI Era," vol. 1, Lattice Press, Sunset Beach, Calif., 1990, p. 441, have the property of not reflecting radiomagnetic energy, including phonons and ions, as most, especially reflective surfaces, would do. ARC materials are opaque and are useful as non-reflective coatings when formed over reflecting surfaces, such as titanium nitride over aluminum. There is also the so-called bottom-anti-reflective coating, or BARC, which can be either opaque or translucent, and yet not reflect, nor transmit electromagnetic radiation. Therefore, BARC can be placed below or at the "bottom" of a layer, and yet not transmit radiation to a still lower layer underneath the BARC. Thus, BARC layer (150), a main feature of this invention, is formed by depositing silicon-oxynitride (SiON) or organic BARC on the substrate, filling, at the same time, hole formed in ULD and LLD layers, (130) and (110), respectively. Subsequent to the forming of BARC layer (150) as shown in FIG. 2c, a second photoresist layer (160) is formed and patterned with a mask having conductive line pattern (165'). The preferred thickness of the second layer of photoresist is between about 1.0 to 1.2 μm.

In a first embodiment of this invention, BARC is next removed from the areas not covered by the second photoresist layer, as shown in FIG. (2d) until about the level of etch-stop layer (120) is reached. This is accomplished by performing a timed-removal with a recipe comprising $O_2/N_2$ for a period between about 30 to 60 seconds. Then, ULD layer (130) is etched using recipe $CF_4/CHF_3$, thus forming conductive line opening (165) in the ULD layer until etch-stop layer (120) is reached, as shown in FIG. 2e. Alternatively, and as a second embodiment, both BARC and ULD are etched simultaneously, using etch recipe $CF_4/CHF_3$ to form the same structure as shown in the same FIG. 2e. It is possible that the level or height of BARC in hole (145) will vary in each embodiment depending upon the selectivity of etchant relative to BARC; however, in either case, the BARC has served its purpose of protecting the exposed substructure at the bottom of the hole from the damage that can be caused by the second etching energy utilized to form conductive line pattern (165) in ULD layer (130).

Figure 2F:
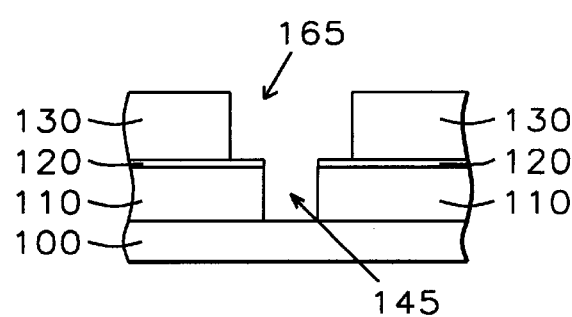
FIG. 2f shows the complete removal of the protective filler in the hole opening of FIG. 2d, according to the first and second embodiments of this invention.
Figure 2G:
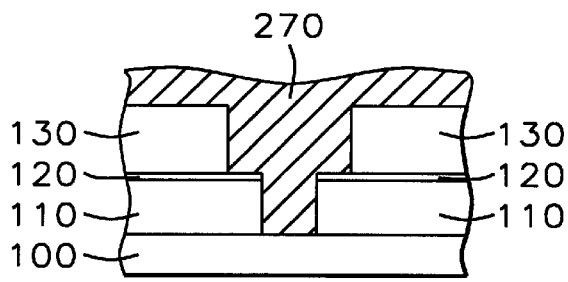
FIG. 2g shows the metal filling of the composite conductive line and hole structure of this invention.
Figure 2H:
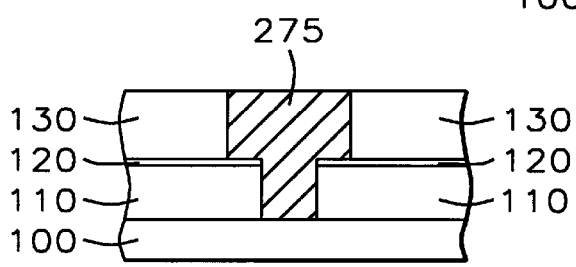
FIG. 2h shows the planarization and forming of the composite metal interconnection of the dual damascene structure of this invention.

As a penultimate step to forming the composite dual damascene structure of this invention, comprising conductive line opening (165) and contact or via hole opening (145) as shown in FIG. 2f, BARC is removed from hole (145) with a wet-etch solution comprising $H_2SO_4/H_2O_2$. A metal layer (170), such as aluminum copper is next deposited into this new damascene structure as shown in FIG. 2g. Finally, chemical mechanical polishing is performed in order to planarize the metallized surface and form the composite conductive line and contact or via hole interconnection (175) as a preparation for completing the remaining process steps of fabricating the semiconductor substrate. The resulting composite structure, including the etch-stop layer, is shown in FIG. 2h. In both the first and second embodiments of this invention, etch-stop layer (120) remains within the dual damascene structure as shown in FIG. 2h.

Figure 3B:
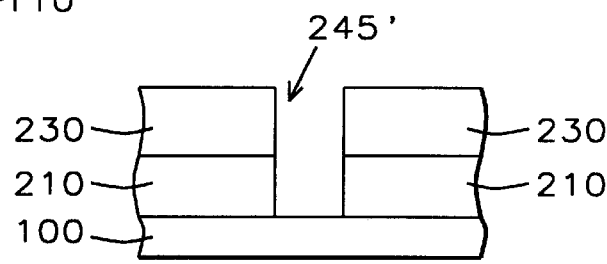
FIGS. 3a–3g show as a third embodiment, the forming of the robust dual damascene structure of this invention as in the first and second embodiments, however, without an etch-stop layer.

One may also choose titanium nitride, TiN, as the preferred etch-stop material since it has a lower resistivity than the other etch barrier materials. It is also possible to omit the etch-stop layer altogether, when applied with the present invention. Thus, as a third embodiment, FIG. 3a shows a portion of substrate (100) having LLD layer (210), ULD layer (230) without an intervening etch-stop layer, and deposited with a first photoresist layer (140). It is preferred that both LLD and ULD layers have a thickness between about 8,000 to 15,000 angstroms (Å).

After the forming of LLD, ULD and etch-stop layers, a first photoresist layer (240) of a thickness between about 1.0 to 1.2 Å is formed and then patterned with a mask having a hole pattern (245'), as shown in FIG. 3a. The hole pattern is next etched into the ULD, etch-stop and LLD layers as shown in FIG. 3b, forming hole (245), which, at its bottom, exposes the underlying substructure of substrate (100). It is preferred that the etching of both ULD layer (230) and LLD layer (210) is performed with recipe comprising gases $CH_4/CHF_3$ at flow rates between about 10 to 100 sccm. Subsequent to forming the hole pattern in the substrate as shown in FIG. 3b, first photoresist layer (240) is removed with oxygen ashing.

Figure 3C:
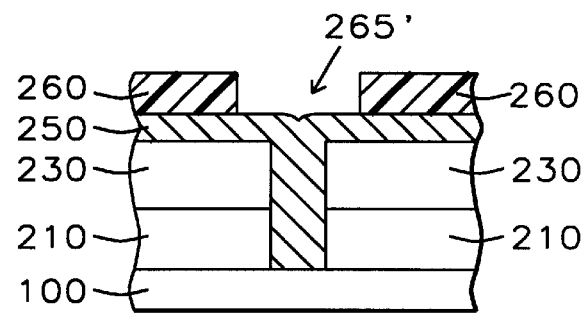
Figure 3A:
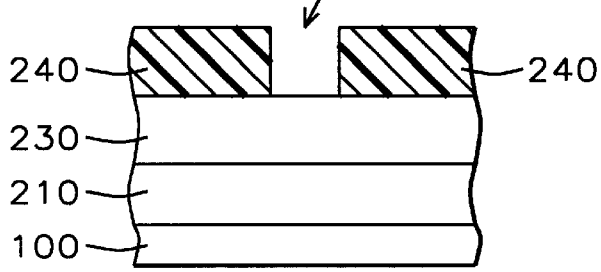
Figure 3D:
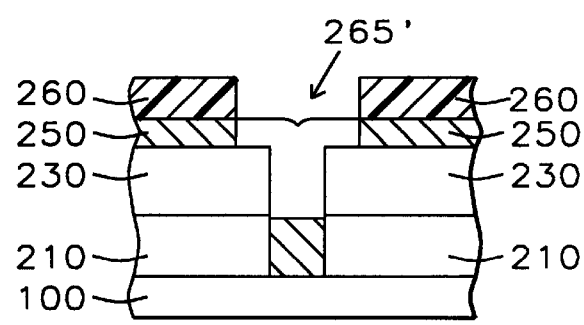

At the next step, and as a main feature and key aspect of the present invention, a bottom-anti-reflective coating material, BARC, is formed over the substrate filling hole (245), thus forming a protective cover over the exposed substructure at the bottom of the hole, as shown in FIG. 3c. Thus, BARC layer (250), a main feature of this invention, is formed by depositing SiON or organic BARC on the substrate, filling, at the same time, hole formed in ULD and LLD layers, (230) and (210), respectively. Subsequent to the forming of BARC layer (250) as shown in FIG. 3c, a second photoresist layer (260) is formed and patterned with a mask having conductive line pattern (265'). The preferred thickness of the second layer of photoresist is between about 1.0 to 1.2 μm.

Figure 3E:
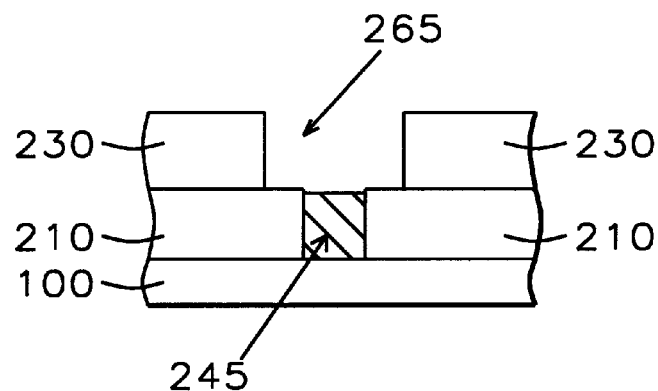

In this embodiment of this invention, BARC is next removed from the areas not covered by the second photoresist layer, as shown in FIG. (3d) until about half the depth of hole (245) is reached. This is accomplished by performing a timed-removal with a recipe comprising $O_2/N_2$ for a period between about 30 to 60 seconds. Then, ULD layer (230) is etched using recipe $CF_4/CHF_3$ and for a period between about 90 to 150 seconds, thus forming conductive line opening (265) in the ULD layer at a depth of about the thickness of the ULD layer, as shown in FIG. 3e. Alternatively, both BARC and ULD are etched simultaneously, using etch recipe $CF_4/CHF_3$ for between about 90 to 150 seconds, to form the same structure as shown in the same FIG. 3e. It is possible that the level or height of BARC in hole (245) will vary in each case depending upon the selectivity of etchant relative to BARC; however, in either case, the BARC has served its purpose of protecting the exposed substructure at the bottom of the hole from the damage that can be caused by the second etching energy utilized to form conductive line pattern (265) in ULD layer (230).

Figure 3F:
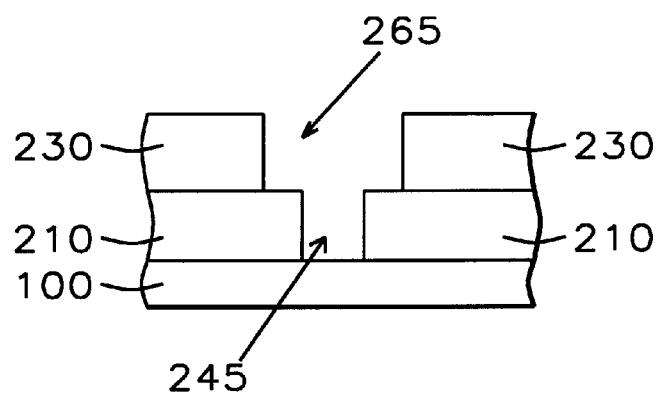
Figure 3G:
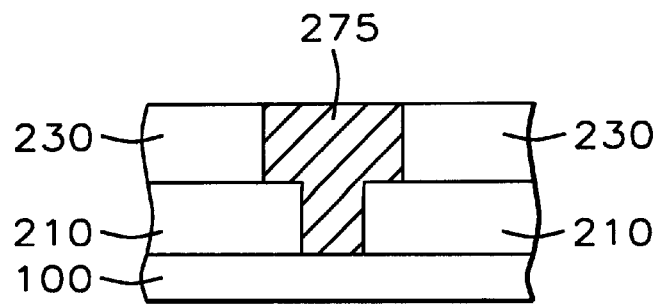

As a penultimate step to forming the composite dual damascene structure of this invention, comprising conductive line opening (265) and contact or via hole opening (245) as shown in FIG. 3f, BARC is removed from hole (245) with a wet-etch solution comprising $H_2SO_4/H_2O_2$. A metal, such as aluminum copper is next deposited into this new damascene structure and the excess metal (not shown) is removed by using chemical mechanical polishing to form composite conductive line and contact or via hole interconnection (275) as a preparation for completing the remaining process steps of fabricating the semiconductor substrate. The resulting robust dual damascene structure is shown in FIG. 3g.

While the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene structure with a protective coating in hole openings comprising the steps of:

providing a semiconductor substrate having a substructure comprising devices formed in said substrate and a metal layer formed thereon;

forming a lower level dielectric (LLD) layer over said substrate;

forming an etch-stop layer over said LLD layer;

forming an upper level dielectric (ULD) layer over said etch-stop layer;

forming a first photoresist layer over said ULD layer;

patterning said first photoresist layer with a hole pattern;

etching through said hole pattern in said first photoresist layer into said ULD layer;

etching further said hole pattern into said etch-stop layer;

etching further said hole pattern into said LLD layer until a lower level said substructure of said substrate is reached;

removing said first photoresist layer from said substrate;

forming a bottom-anti-reflective coating (BARC) over said substrate and filling said hole opening with said BARC;

forming a second photoresist layer over said BARC over said substrate including said hole opening;

patterning said second photoresist layer with a conductive line opening pattern;

performing a timed-etch through said conductive line opening in said second photoresist layer to remove said BARC from said hole opening in said ULD layer and partially from said hole opening in said LLD layer;

etching through said conductive line opening in said second photoresist layer into said ULD layer until etch-stop layer is reached;

removing said second photoresist layer;

removing remaining said BARC from said hole opening in said LLD layer;

forming metal in said conductive line opening in said ULD layer and hole opening through said etch-stop layer and in said LLD layer; and removing said metal from the surface of said substrate for subsequent process steps to complete the fabrication of a semiconductor substrate.

2. The method of claim 1, wherein said LLD layer comprises silicon oxide, silicon nitride or silicon-oxynitride.

3. The method of claim 1, wherein said LLD layer has a thickness between 8,000 to 15,000 Å.

4. The method of claim 1, wherein said forming an etch-stop layer over said LLD layer is accomplished by reacting dichlorosilane ($SiCl_2H_2$) with ammonia ($NH_3$) in an LPCVD at a pressure between about 0.25 to 1.0 torr, temperature between 650 to 750° C. and at flow rates between 80 to 120 standard cubic centimeters per minute (sccm).

5. The method of claim 1, wherein said ULD layer comprises silicon oxide, silicon nitride or silicon-oxynitride.

6. The method of claim 1, wherein said ULD layer has a thickness between 8,000 to 5,000 Å.

7. The method of claim 1, wherein said first photoresist layer over said ULD layer has a thickness between 1.0 to 1.2 micrometers ($\mu$m).

8. The method of claim 1, wherein said patterning said first photoresist layer is accomplished with a mask having said hole pattern.

9. The method of claim 1, wherein said etching through said hole pattern in said first photoresist layer into said ULD layer is accomplished with a recipe comprising $CHF_4/CHF_3$ gases.

10. The method of claim 1, wherein said etching further said hole pattern into said etch-stop layer is accomplished with a recipe comprising $CHF_4/CHF_3$ gases.

11. The method of claim 1, wherein said etching further said hole pattern in said LLD layer until a lower level said substructure of said substrate is reached is accomplished with a recipe comprising $CHF_4/CHF_3$ gases.

12. The method of claim 1, wherein said first photoresist layer is removed by oxygen ashing.

13. The method of claim 1, wherein said forming a bottom-anti-reflective coating (BARC) over said substrate and filling said hole opening with said BARC is accomplished by silicon-oxynitride of organic BARC.

14. The method of claim 1, wherein said second photoresist layer over said BARC has a thickness between 700 to 1300 Å.

15. The method of claim 1, wherein said patterning said second photoresist layer is accomplished with a mask having said conductive line opening pattern.

16. The method of claim 1, wherein said timed-etch through said conductive line opening in said second photoresist layer to remove said BARC from said hole opening in said ULD layer is accomplished with a recipe comprising gases $O_2$ with a flow rate between 10 to 100 sccm, $N_2$ between 10 to 100 sccm, and for a period of between 30 to 60 seconds.

17. The method of claim 16, wherein said removing said metal from the surface of said substrate is accomplished by chemical mechanical polishing.

18. The method of claim 1, wherein said etching through said conductive line opening in said second photoresist layer into said LLD layer until etch-stop layer is reached is accomplished with a recipe comprising gases $CF_4$ with a flow rate between 10 to 100 sccm, $CHF_3$ between about 10 to 100 sccm, respectively.

19. The method of claim 1, wherein said removing said second photoresist layer is accomplished with oxygen ashing.

20. The method of claim 1, wherein said removing remaining said BARC from said hole opening in said LLD layer is accomplished with a wet-etch solution comprising $H_2SO_4/H_2O_2$.

21. The method of claim 1, wherein said forming metal in said conductive line opening in said ULD layer and hole opening through said etch-stop layer and in said LLD layer is accomplished by depositing aluminum copper.

22. A method of forming a dual damascene structure with a protective coating in hole openings comprising the steps of:

providing a semiconductor substrate having a substructure comprising devices formed in said substrate and a metal layer formed thereon;

forming a lower level dielectric (LLD) layer over said substrate;

forming an etch-stop layer over said LLD layer;

forming an upper level dielectric (ULD) layer over said etch-stop layer;

forming a first photoresist layer over said ULD layer;

patterning said first photoresist layer with a hole pattern;

etching through said hole pattern in said first photoresist layer into said ULD layer;

etching further said hole pattern into said etch-stop layer;

etching further said hole pattern in said LLD layer until a lower level said substructure of said substrate is reached;

removing said first photoresist layer from said substrate;

depositing a bottom-anti-reflective coating (BARC) over said substrate filling said hole opening with said BARC;

forming a second photoresist layer over said BARC over said substrate including said hole opening;

patterning said second photoresist layer with a conductive line opening pattern;

performing a simultaneous etch of both said BARC and said ULD layer through said conductive line opening in said second photoresist layer until said etch-stop layer is reached, thus leaving a portion of said BARC in said hole opening in said LLD layer;

removing said second photoresist layer;

removing said portion of said BARC from said hole opening in said LLD layer;

depositing metal in said conductive line opening in said ULD layer and hole opening through said etch-stop layer and in said LLD layer; and removing said metal from the surface of said substrate for subsequent process steps to complete the fabrication of a semiconductor substrate.

23. The method of claim 22, wherein said LLD layer comprises silicon oxide, silicon nitride or silicon-oxynitride.

24. The method of claim 22, wherein said LLD layer has a thickness between about 8,000 to 15,000 Å.

25. The method of claim 22, wherein said forming an etch-stop layer over said LLD layer is accomplished by reacting dichlorosilane ($SiCl_2H_2$) with ammonia ($NH_3$) in an LPCVD at a pressure between 0.25 to 1.0 torr, temperature between 650 to 750° C. and at flow rates between 80 to 120 standard cubic centimeters per minute (sccm).

26. The method of claim 22, wherein said ULD layer comprises silicon oxide, silicon nitride or silicon-oxynitride.

27. The method of claim 26, wherein said removing said metal from the surface of said substrate is accomplished by chemical mechanical polishing.

28. The method of claim 22, wherein said ULD layer has a thickness between 8,000 to 15,000 Å.

29. The method of claim 22, wherein said first photoresist layer over said ULD layer has a thickness between 1.0 to 1.2 micrometers ($\mu m$).

30. The method of claim 22, wherein said patterning said first photoresist layer is accomplished with a mask having said hole pattern.

31. The method of claim 22, wherein said etching through said hole pattern in said first photoresist layer into said ULD layer is accomplished with a recipe comprising $CHF_4/CHF_3$.

32. The method of claim 22, wherein said etching further said hole pattern into said etch-stop layer is accomplished with a recipe comprising $CHF_4/CHF_3$.

33. The method of claim 22, wherein said etching further said hole pattern in said LLD layer until a lower level said substructure of said substrate is reached is accomplished with a recipe comprising $CHF_4/CHF_3$.

34. The method of claim 22, wherein said first photoresist layer is removed by oxygen ashing.

35. The method of claim 22, wherein said forming a bottom-anti-reflective coating (BARC) over said substrate and filling said hole opening with said BARC is accomplished by silicon-oxynitride or organic BARC.

36. The method of claim 22, wherein said second photoresist layer over said BARC has a thickness between 700 to 1300 Å.

37. The method of claim 22, wherein said patterning said second photoresist layer is accomplished with a mask having said conductive line opening pattern.

38. The method of claim 22, wherein said performing a simultaneous etch of both said BARC and said ULD layer through said conductive line opening in said second photoresist layer until said etch-stop layer is reached, thus leaving a portion of said BARC in said hole opening in said LLD layer is accomplished with a recipe comprising gases $CF_4$ with a flow rate between 10 to 100 sccm, $CHF_3$ between 10 to 100 sccm, and for a period of between 90 to 150 seconds.

39. The method of claim 22, wherein said removing said second photoresist layer is accomplished with oxygen ashing.

40. The method of claim 22, wherein said removing remaining said portion of said BARC from said hole opening in said LLD layer is accomplished with a wet-etch solution comprising $H_2SO_4/H_2O_2$.

41. The method of claim 22, wherein said forming metal in said conductive line opening in said ULD layer and hole opening through said etch-stop layer and in said LLD layer is accomplished by depositing aluminum copper.

* * * * *